United States Patent
Chung et al.

(10) Patent No.: US 8,120,177 B2
(45) Date of Patent: *Feb. 21, 2012

(54) WAFER LEVEL PACKAGE HAVING A STRESS RELIEF SPACER AND MANUFACTURING METHOD THEREOF

(75) Inventors: Hyun-Soo Chung, Hwasung (KR); Ho-Jin Lee, Seoul (KR); Dong-Hyun Jang, Suwon (KR); Dong-Ho Lee, Seongnam (KR)

(73) Assignee: Samsung Electronics Co., Ltd. (KR)

( * ) Notice: Subject to any disclaimer, the term of this patent is extended or adjusted under 35 U.S.C. 154(b) by 0 days.

This patent is subject to a terminal disclaimer.

(21) Appl. No.: 12/910,260

(22) Filed: Oct. 22, 2010

(65) Prior Publication Data

US 2011/0031621 A1 Feb. 10, 2011

Related U.S. Application Data

(60) Continuation of application No. 12/496,176, filed on Jul. 1, 2009, now Pat. No. 7,838,992, which is a division of application No. 11/355,545, filed on Feb. 15, 2006, now Pat. No. 7,572,673.

(30) Foreign Application Priority Data

Jan. 4, 2006 (KR) .................. 10-2006-0000786

(51) Int. Cl.
- *H01L 23/48* (2006.01)
- *H01L 23/52* (2006.01)
- *H01L 29/40* (2006.01)

(52) U.S. Cl. ............. 257/738; 257/773; 257/E23.023; 257/E23.168

(58) Field of Classification Search .................. 257/738, 257/773, E23.023, E23.168
See application file for complete search history.

(56) References Cited

U.S. PATENT DOCUMENTS 5,646,067 A 7/1997 Gaul
(Continued)

FOREIGN PATENT DOCUMENTS

JP 2002-198463 7/2002
(Continued)

OTHER PUBLICATIONS

"Wafer Level Package Having a Stress Relief Spacer and Manufacturing Method Thereof," Specification, Drawings, and Prosecution History of U.S. Appl. No. 12/496,176, filed Jul. 1, 2009, by Hyun-Soo Chung, et al., which is stored in the United States Patent and Trademark Office (USPTO) Image File Wrapper (IFW) system.

*Primary Examiner* — Lex Malsawma
(74) *Attorney, Agent, or Firm* — Onello & Mello, LLP

(57) ABSTRACT

In a semiconductor device package having a stress relief spacer, and a manufacturing method thereof, metal interconnect fingers extend from the body of a chip provide for chip interconnection. The metal fingers are isolated from the body of the chip by a stress-relief spacer. In one example, such isolation takes the form of an air gap. In another example, such isolation takes the form of an elastomer material. In either case, mismatch in coefficient of thermal expansion between the metal interconnect fingers and the body of the chip is avoided, alleviating the problems associated with cracking and delamination, and leading to improved device yield and device reliability.

28 Claims, 22 Drawing Sheets

U.S. PATENT DOCUMENTS

| | | |
|---|---|---|
| 5,648,684 A | 7/1997 | Bertin et al. |
| 5,925,924 A | 7/1999 | Cronin et al. |
| 7,572,673 B2 | 8/2009 | Chung et al. |
| 7,838,992 B2 * | 11/2010 | Chung et al. ............... 257/738 |
| 2003/0194860 A1 * | 10/2003 | Nemoto ...................... 438/667 |
| 2005/0003649 A1 | 1/2005 | Takao |
| 2007/0152349 A1 | 7/2007 | Chung et al. |

FOREIGN PATENT DOCUMENTS

| | | |
|---|---|---|
| JP | 2003-017621 | 1/2003 |

* cited by examiner

WAFER LEVEL PACKAGE HAVING A STRESS RELIEF SPACER AND MANUFACTURING METHOD THEREOF

RELATED APPLICATIONS

This application is a continuation application of U.S. patent application Ser. No. 12/496,176, filed on Jul. 1, 2009, which is a divisional application of U.S. patent application Ser. No. 11/355,545, filed on Feb. 15, 2006, which claims the benefit of Korean patent application number 10-2006-0000786, filed on Jan. 4, 2006, in the Korean Intellectual Property Office, the contents of which applications are incorporated herein in their entirety by reference.

FIELD OF THE INVENTION

The present invention relates to a semiconductor device package including a stress relief mechanism, and manufacturing methods thereof.

BACKGROUND OF THE INVENTION

Semiconductor manufacturing and packaging technology has evolved to the point where device packages can include multiple integrated circuit chips in a stacked relationship in order to provide a smaller form factor and higher integration density at the package level. In such packages, the individual chips each include a multitude of signals that are to be externally transferred. Such transfer occurs over a plurality of metal interconnects that distribute signals to an end surface of the chip. The metal interconnects of different chips in the stack are connected according to a number of different techniques.

Mechanical stress can develop between layers of a chip or between adjacent chips of a package. Such stress is typically caused by a mismatch in coefficient of thermal expansion (CTE) between two adjacent layers. In conventional packages, chips are stacked and interconnected using vertical vias that pass through a silicon substrate, insulated from the substrate by a dielectric layer. In this situation, during device fabrication, or later during device operation, heating and cooling processes can cause damage to the via. This is often times due to the CTE mismatch between the layers. For example, silicon has a CTE value of 3, while the dielectric layer can have a CTE value on the order of 50-60; resulting in a large mismatch. To a lesser degree, the metal of the via has a CTE value on the order of 20 as compared to the dielectric layer CTE value of 50-60, resulting in a mismatch. Such mismatch can cause cracking and delamination when subjected to numerous heating and cooling thermal cycles, negatively affecting device yield during manufacture, and device reliability during operation.

SUMMARY OF THE INVENTION

The present invention is directed to a semiconductor device package having a stress relief spacer, and a manufacturing method thereof. Metal fingers that extend from the body of a chip provide for chip interconnection. The metal fingers are isolated from the body of the chip by a stress-relief spacer. In one example, such isolation takes the form of an air gap. In another example, such isolation takes the form of an elastomer material. In either case, CTE mismatch between the metal interconnect fingers and the body of the chip is avoided, alleviating the problems associated with cracking and delamination. This leads to an improvement in device yield and device reliability.

In one aspect, the present invention is directed to a method of manufacturing a semiconductor device. The method comprises forming a semiconductor device on a substrate, the semiconductor device including a bonding pad in a device region of the substrate; forming a first opening in a scribe lane region of the substrate that partially extends through the substrate; forming a dielectric layer on the substrate between the bonding pad and the first opening, and covering a side wall of the first opening; providing a material layer pattern in the first opening that covers the dielectric layer in the first opening, the material layer pattern including a second opening; and providing a conductive interconnect in contact with the bonding pad, on the dielectric layer, and filling the second opening, a horizontal portion of the conductive interconnect extending from the bonding pad to the second opening, and a vertical portion of the conductive interconnect extending from the horizontal portion and into the second opening.

In one embodiment, providing a conductive interconnect comprises: providing a seed metal layer on the bonding pad, the dielectric layer and the material layer pattern; providing a metal layer on the seed metal layer; and patterning the seed metal layer and the metal layer to form the conductive interconnect.

In another embodiment, the method further comprises removing the material layer pattern in the first opening between the dielectric layer and the vertical portion of the conductive interconnect.

In another embodiment, the method further comprises following removing the material layer pattern in the first opening, providing an elastomer material in the first opening. In another embodiment, an air gap exists between the vertical portion of the conductive interconnect and the dielectric layer following removal of the material layer.

In another embodiment, the method further comprises providing a second dielectric layer on the conductive interconnect that is patterned to expose a portion of an upper surface of the conductive interconnect.

In another embodiment, the method further comprises removing substrate material from a lower surface of the substrate to expose a lower end of the vertical portion of the conductive interconnect.

In another embodiment, removing the substrate material comprises performing at least one of chemical polishing and mechanical polishing.

In another embodiment, the method further comprises applying solder balls to the exposed lower ends of the vertical portions of the conductive interconnects.

In another embodiment, the substrate comprises a wafer including at least two chip substrates partitioned by the scribe lane, the dielectric layer covers first and second opposed side walls of the first opening, the material layer pattern in the first opening creates two second openings in the first opening, and providing a conductive interconnect provides first and second conductive interconnects extending from respective bonding pads on the respective chip substrates into the respective second openings.

In another embodiment, the method further comprises removing substrate material from lower surfaces of the substrates to expose lower ends of the vertical portions of the first and second conductive interconnects, and dicing the substrates between the first and second conductive interconnects.

In another embodiment, multiple conductive interconnects are formed on the substrate and further comprising bonding the multiple conductive interconnects to respective interconnects of a second substrate.

In another embodiment, the material layer pattern comprises an elastomer material or a photoresist material.

In another aspect, the present invention is directed to a method of manufacturing a semiconductor device comprising: forming a semiconductor device on a substrate, the semiconductor device including a bonding pad in a device region of the substrate; forming a first opening in a scribe lane region of the substrate that partially extends through the substrate; providing a material layer pattern in the first opening that covers a sidewall of the first opening, the material layer pattern including a second opening; forming a dielectric layer on the substrate between the bonding pad and the second opening, and covering a side wall of the second opening; and providing a conductive interconnect in contact with the bonding pad, on the dielectric layer, and filling the second opening, a horizontal portion of the conductive interconnect extending from the bonding pad to the second opening, and a vertical portion of the conductive interconnect extending from the horizontal portion and into the second opening.

In one embodiment, providing a conductive interconnect comprises: providing a seed metal layer on the bonding pad and the dielectric layer; providing a metal layer on the seed metal layer; and patterning the seed metal layer and the metal layer to form the conductive interconnect.

In another embodiment, the method further comprises removing the material layer pattern in the first opening between the dielectric layer and the side wall of the first opening.

In another embodiment, the method further comprises, following removing the material layer pattern in the first opening, providing an elastomer material in the first opening.

In another embodiment, an air gap exists between the vertical portion of the conductive interconnect and the sidewall of the first opening following removal of the material layer.

In another embodiment, the method further comprises providing a second dielectric layer on the conductive interconnect that is patterned to expose a portion of an upper surface of the conductive interconnect.

In another embodiment, the method further comprises removing substrate material from a lower surface of the substrate to expose a lower end of the vertical portion of the conductive interconnect.

In another embodiment, removing the substrate material comprises performing at least one of chemical polishing and mechanical polishing.

In another embodiment, the method further comprises applying solder balls to the exposed lower ends of the vertical portions of the conductive interconnects.

In another embodiment, the substrate comprises a wafer including at least two chip substrates partitioned by the scribe lane, the first material pattern in the first opening creates two second openings in the first opening, the dielectric layer covers a side wall of each of the two second openings, and providing a conductive interconnect provides first and second conductive interconnects extending from respective bonding pads on the respective chip substrates into the respective second openings.

In another embodiment, the method further comprises removing substrate material from lower surfaces of the substrates to expose lower ends of the vertical portions of the first and second conductive interconnects, and dicing the substrates between the first and second conductive interconnects.

In another embodiment, multiple conductive interconnects are formed on the substrate and further comprising bonding the multiple conductive interconnects to respective interconnects of a second substrate.

In another embodiment, the material layer pattern comprises an elastomer material or a photoresist material.

In another aspect, the present invention is directed to a semiconductor device comprising: a semiconductor device on a substrate, the semiconductor device including a bonding pad in a device region of the substrate; a dielectric layer on the substrate, a horizontal portion of the dielectric layer between the bonding pad and an outer side surface of the substrate, and a vertical portion of the dielectric layer covering the outer side surface of the substrate; and a conductive interconnect on the dielectric layer in contact with the bonding pad, a horizontal portion of the conductive interconnect extending from the bonding pad to the outer side surface of the substrate, and a vertical portion of the conductive interconnect extending from the horizontal portion of the conductive interconnect and in a vertical direction along the outer side surface of the substrate, the vertical portion of the conductive interconnect being spaced apart from the vertical portion of the dielectric layer.

In one embodiment, the conductive interconnect comprises: a seed metal layer on the bonding pad and the dielectric layer, and a metal layer on the seed metal layer.

In another embodiment, the device further comprises an elastomer material between the vertical portion of the conductive interconnect and the vertical portion of the dielectric layer.

In another embodiment, the device further comprises a second dielectric layer on the conductive interconnect that is patterned to expose a portion of an upper surface of the conductive interconnect.

In another embodiment, the lower end of the vertical portion of the conductive interconnect extends to a lower surface of the substrate.

In another embodiment, an air gap exists between the vertical portion of the conductive interconnect and the vertical portion of the dielectric layer.

In another embodiment, the outer side surface of the substrate is a side wall of a scribe lane of a wafer that is diced to provide the substrate.

In another embodiment, multiple conductive interconnects are formed on the substrate and further comprising a second substrate and wherein the multiple conductive interconnects are bonded to respective interconnects of the second substrate.

In another embodiment, the interconnects are bonded using solder balls.

In another aspect, the present invention is directed to a semiconductor device comprising: a semiconductor device on a substrate, the semiconductor device including a bonding pad in a device region of the substrate; a dielectric layer on the substrate, a horizontal portion of the dielectric layer between the bonding pad and an outer side surface of the substrate, and a vertical portion of the dielectric layer extending from the horizontal portion of the dielectric layer and in a vertical direction along the outer side surface of the substrate, the vertical portion of the dielectric layer being spaced apart from the outer side surface of the substrate; and a conductive interconnect on the dielectric layer in contact with the bonding pad, a horizontal portion of the conductive interconnect extending from the bonding pad past the outer side surface of the substrate, and a vertical portion of the conductive interconnect extending from the horizontal portion of the conductive interconnect and in a vertical direction along the outer side surface of the substrate, the vertical portion of the conductive interconnect adjacent the vertical portion of the dielectric layer and being spaced apart from the outer side surface of the substrate.

In one embodiment, the conductive interconnect comprises: a seed metal layer on the bonding pad and the dielectric layer, and a metal layer on the seed metal layer.

In another embodiment, the device further comprises an elastomer material between the vertical portion of the dielectric layer and the outer side surface of the substrate.

In another embodiment, the device further comprises a second dielectric layer on the conductive interconnect.

In another embodiment, the lower end of the vertical portion of the conductive interconnect extends to a lower surface of the substrate.

In another embodiment, an air gap exists between the vertical portion of the dielectric layer and the outer side surface of the substrate.

In another embodiment, the outer side surface of the substrate is a side wall of a scribe lane of a wafer that is diced to provide the substrate.

In another embodiment, multiple conductive interconnects are formed on the substrate and further comprising a second substrate and wherein the multiple conductive interconnects are bonded to respective interconnects of the second substrate.

In another embodiment, the interconnects are bonded using solder balls.

In another aspect, the present invention is directed to a semiconductor device comprising: a semiconductor device on a substrate, the semiconductor device including a bonding pad in a device region of the substrate; a dielectric layer on the substrate, a horizontal portion of the dielectric layer between the bonding pad and an outer side surface of the substrate, and a vertical portion of the dielectric layer covering the outer side surface of the substrate; and a conductive interconnect on the dielectric layer in contact with the bonding pad, a horizontal portion of the conductive interconnect extending from the bonding pad to the outer side surface of the substrate, and a vertical portion of the conductive interconnect extending from the horizontal portion of the conductive interconnect and in a vertical direction along the outer side surface of the substrate, the vertical portion of the conductive interconnect being spaced apart from the vertical portion of the dielectric layer; and an elastomer material between the vertical portion of the conductive interconnect and the vertical portion of the dielectric layer.

In one embodiment, the elastomer material comprises siloxane.

In another aspect, the present invention is directed to a semiconductor device comprising: a semiconductor device on a substrate, the semiconductor device including a bonding pad in a device region of the substrate; a dielectric layer on the substrate, a horizontal portion of the dielectric layer between the bonding pad and an outer side surface of the substrate, and a vertical portion of the dielectric layer extending from the horizontal portion of the dielectric layer and in a vertical direction along the outer side surface of the substrate, the vertical portion of the dielectric layer being spaced apart from the outer side surface of the substrate; an elastomer material between the vertical portion of the dielectric layer and the outer side surface of the substrate; and a conductive interconnect on the dielectric layer in contact with the bonding pad, a horizontal portion of the conductive interconnect extending from the bonding pad past the outer side surface of the substrate, and a vertical portion of the conductive interconnect extending from the horizontal portion of the conductive interconnect and in a vertical direction along the outer side surface of the substrate, the vertical portion of the conductive interconnect adjacent the vertical portion of the dielectric layer and being spaced apart from the outer side surface of the substrate by the elastomer material.

In one embodiment, the elastomer material comprises siloxane.

BRIEF DESCRIPTION OF THE DRAWINGS

The foregoing and other objects, features and advantages of the invention will be apparent from the more particular description of preferred embodiments of the invention, as illustrated in the accompanying drawings in which like reference characters refer to the same parts throughout the different views. The drawings are not necessarily to scale, emphasis instead being placed upon illustrating the principles of the invention.

DETAILED DESCRIPTION OF EMBODIMENTS OF THE INVENTION

Figure 1:
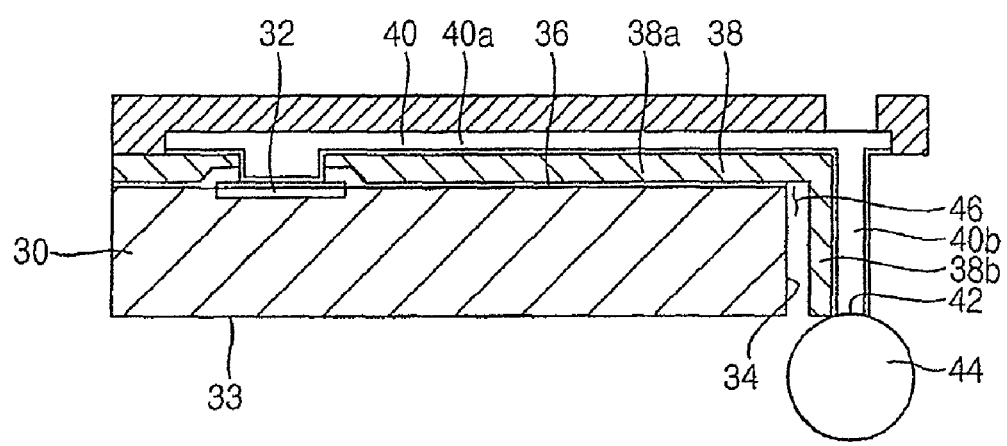
FIG. 1 is a sectional view of a wafer level package (WLP) in accordance with the present invention.

The present invention will now be described more fully hereinafter with reference to the accompanying drawings, in which preferred embodiments of the invention are shown. This invention may, however, be embodied in different forms and should not be construed as limited to the embodiments set forth herein. In the drawings and related description, if a first layer is referred to as being "on" another layer, the first layer can be directly on the other layer, or intervening layers may be present. Like numbers refer to like elements throughout the specification.

FIG. 1 is a sectional view of a wafer level package (WLP) in accordance with the present invention. A WLP according to this embodiment includes a conductive bonding pad 32 provided on a die, or chip, of a semiconductor substrate 30 near an outer edge, or outer side surface, 34 of the semiconductor substrate 30. In one example, the outer edge 34 of the substrate 30 coincides with a scribe lane of a wafer that is cut along the scribe lane to form the die. In a typical embodiment, a plurality of such bonding pads are arranged about the perimeter of the chip.

An oxide layer 36 is provided on a top surface of the substrate 30 between each bonding pad 32 and the outer edge 34. An interlayer dielectric layer pattern 38 is provided on the oxide layer. The dielectric layer pattern 38 includes a horizontal portion 38a that extends horizontally across a top surface of the semiconductor substrate to the outer edge 34 of the substrate and a vertical portion 38b that extends vertically from the horizontal portion 38a in a direction corresponding with the outer edge 34 of the substrate 30.

A plurality of conductive interconnects 40 are provided on the dielectric pattern 38, each conductive interconnect 40 corresponding with a bonding pad 32. At a first end, each conductive interconnect 40 contacts the corresponding bonding pad 32 through an opening in the dielectric layer pattern 38 and the oxide layer 36. Each conductive interconnect 40 includes a horizontal portion 40a that extends horizontally across the horizontal portion 38a of the dielectric layer pattern 38, and a vertical portion 40b that extends vertically from a second end of the horizontal portion 40a in a direction corresponding with the outer edge 34 of the substrate 30. The vertical portion 38b of the dielectric layer pattern 38 is between the vertical portion 40b of the conductive interconnect 40 and the outer edge 34 of the substrate 30 to insulate the vertical portion 40b of the conductive interconnect 40 from the substrate 30.

A lower surface 33 of the substrate 30 is partially removed so as to expose the lower ends 42 of the vertical portions 40b of the conductive interconnects 40. A solder ball 44 makes contact with the lower end 42 of each vertical portion 40b. The solder balls are used for bonding the resulting chip to a lower chip, device, wafer, package, or other substrate, providing both an electrical interconnectivity function and a mechanical anchoring function.

Figure 21:
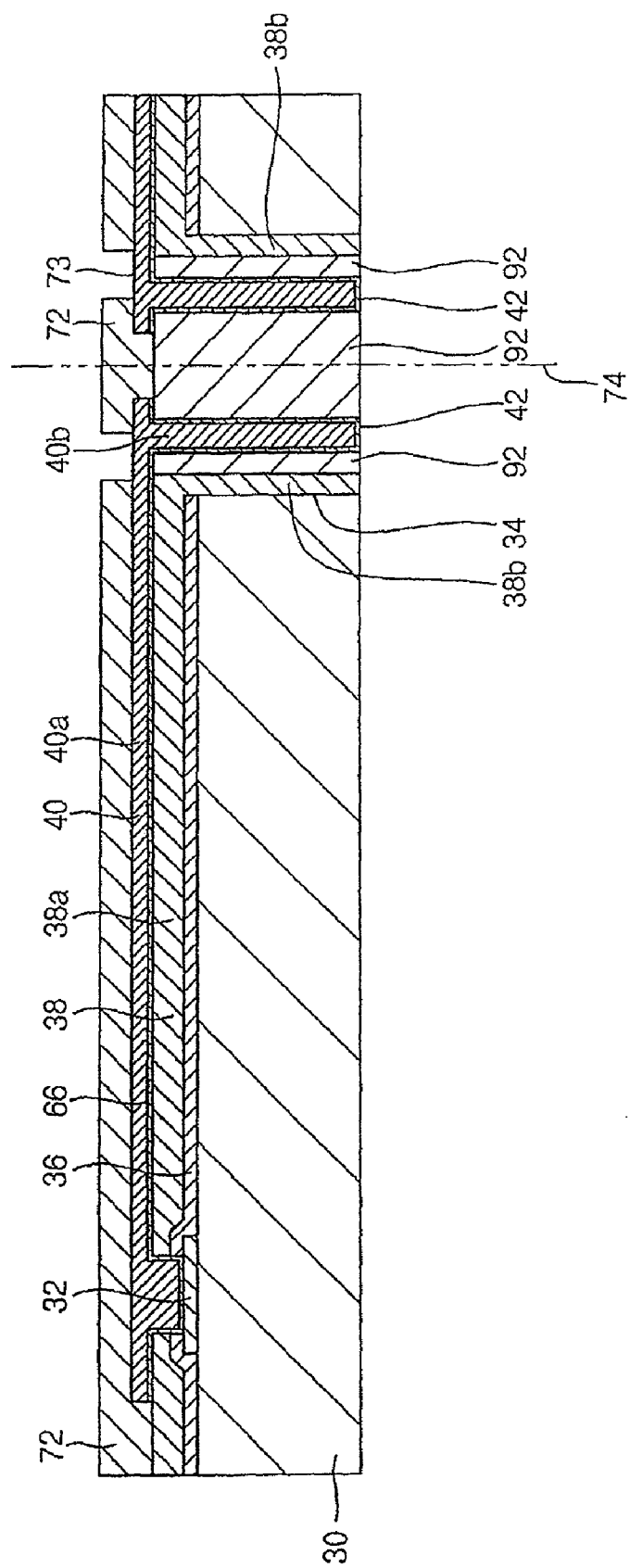
FIGS. 21 and 22 are sectional views of a method for fabricating a wafer level package (WLP) in accordance with a third embodiment of the present invention.
Figure 22:
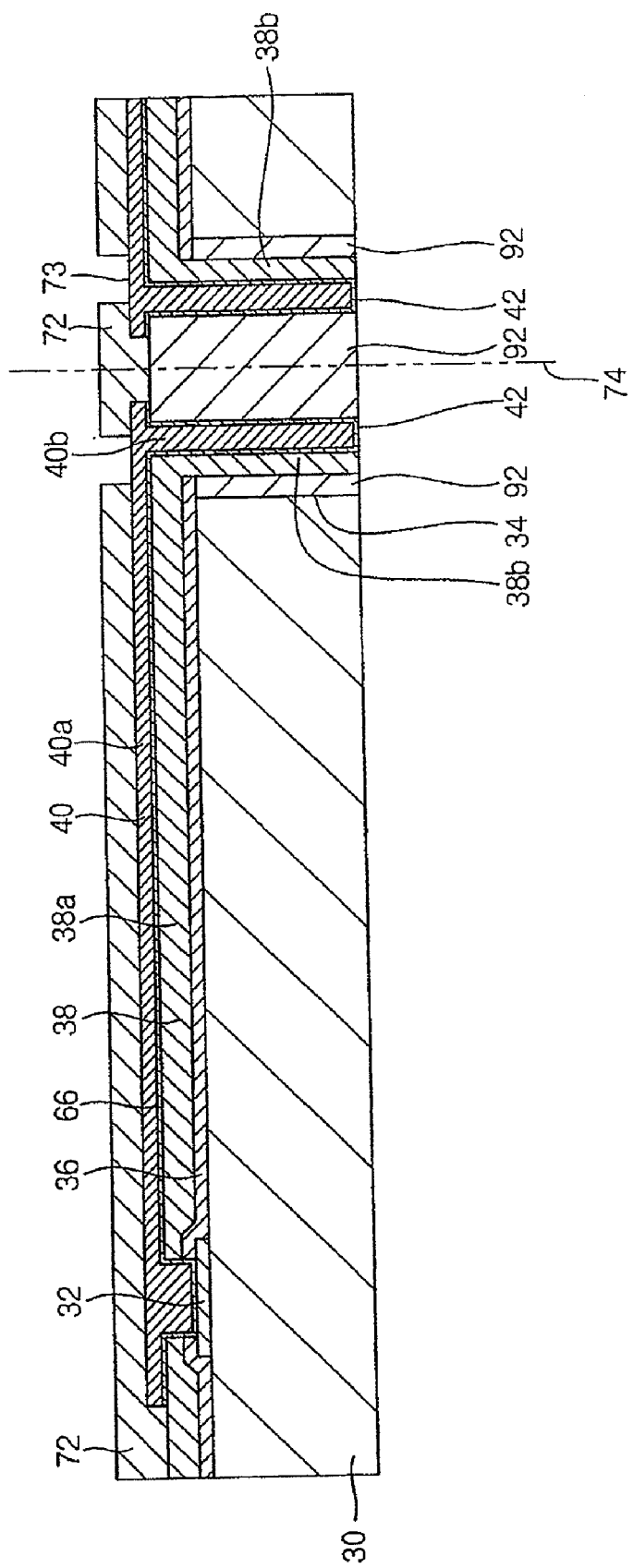

In the embodiment shown, an air gap 46 is provided between the vertical portion 38b of the dielectric layer pattern 38 and the outer edge 34 of the substrate 30. In another embodiment, for example the embodiment shown in FIG. 12 below, the vertical portion 38b of the dielectric layer pattern 38 is formed directly on the outer edge 34 of the substrate 30, and an air gap 46 is provided between the vertical portion 38b of the dielectric layer pattern 38 and the vertical portion 40b of each conductive interconnect 40. In other embodiments, an elastomer is used to fill the air gaps, as shown in FIGS. 21 and 22 below. The elastomer operates as a stress-relief spacer, improving the reliability of the semiconductor device.

FIGS. 2 through 12 are sectional views of a method for fabricating a wafer level package (WLP) in accordance with a first embodiment of the present invention.

Figure 2:
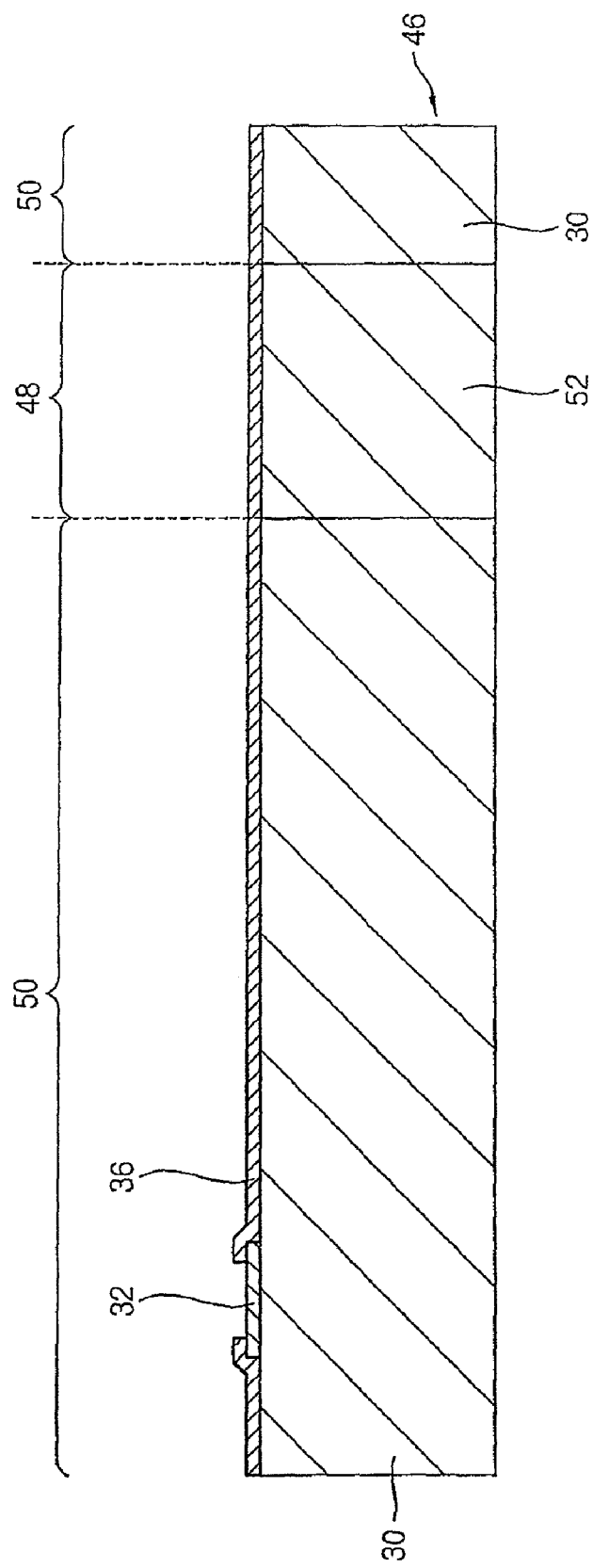
FIGS. 2 through 12 are sectional views of a method for fabricating a wafer level package (WLP) in accordance with a first embodiment of the present invention.

Referring to FIG. 2, a semiconductor wafer 46 is partitioned by a scribe lane 52 into neighboring device regions 50 and scribe lane regions 48. Adjacent dies of the wafer share a common scribe lane 52, which, when fully scribed, or cut, separates the wafers into individual dies. A bonding pad 32, or other conductive feature of the device, is provided in the device region 50. An oxide layer pattern 36, for example comprising silicon oxide or silicon nitride, is formed on a top surface of the substrate, and is patterned to expose the bonding pad 32. The oxide layer pattern 36 is provided as a passivation layer to protect a cell region of the device during fabrication.

Figure 3:
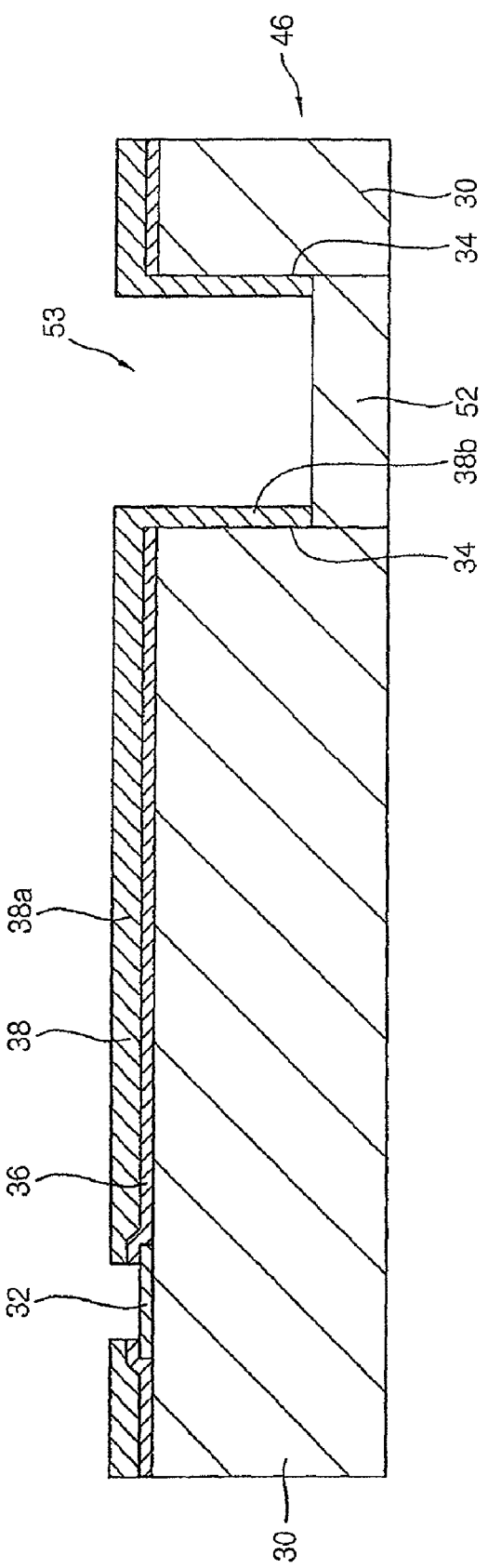

Referring to FIG. 3, the scribe lane 52 is partially diced, or partially removed, to form a first opening 53 so that a lower portion of the substrate 30 body remains in the scribe lane 52. In one example, the scribe lane 52 is partially diced to a depth that corresponds with the eventual desired length of the vertical portions 40b of the conductive interconnects 40 (see FIG. 12, below). An outer edge 34 of the die is exposed by the partial dicing of the scribe lane 52 in the opening 53. A dielectric layer is then applied to the resulting structure, and the dielectric layer is patterned to expose an upper surface of the underlying bonding pad 32. The dielectric layer pattern 38 includes a horizontal portion 38a that extends horizontally across a top surface of the semiconductor substrate to the outer edge 34 of the substrate and a vertical portion 38b that extends vertically from the horizontal portion 38a in a direction along the outer edge 34 of the substrate 30. In this embodiment, the vertical portion 38b of the dielectric layer pattern 38 is applied directly to the exposed outer edge 34 of the substrate die 30 in the scribe lane region. In one embodiment, the dielectric layer comprises a dielectric material, for example photosensitive polyimide (PSPI), photosensitive polybenzooxazole (PSPBO), silicon nitride (SiN), or silicon oxide (SiO), that is applied using a spin coating, or chemical vapor deposition (CVD).

Figure 4:
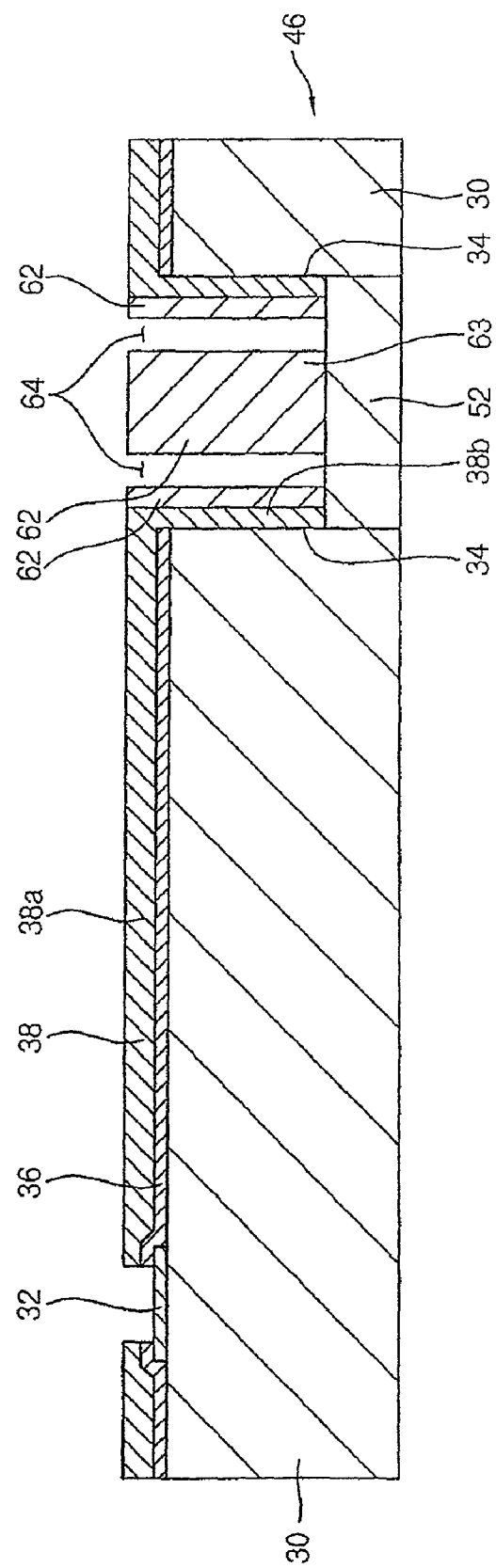

Referring to FIG. 4, a first photoresist layer is formed in the first opening 53 and is patterned to provide a first photoresist layer pattern 62 including a second opening 64. In a case where the scribe lane 52 is provided between adjacent dies of the wafer, the first photoresist layer pattern 62 includes dual second openings 64, the dual second openings 64 being separated by a middle section 63 of first photoresist layer pattern 62.

Figure 5:
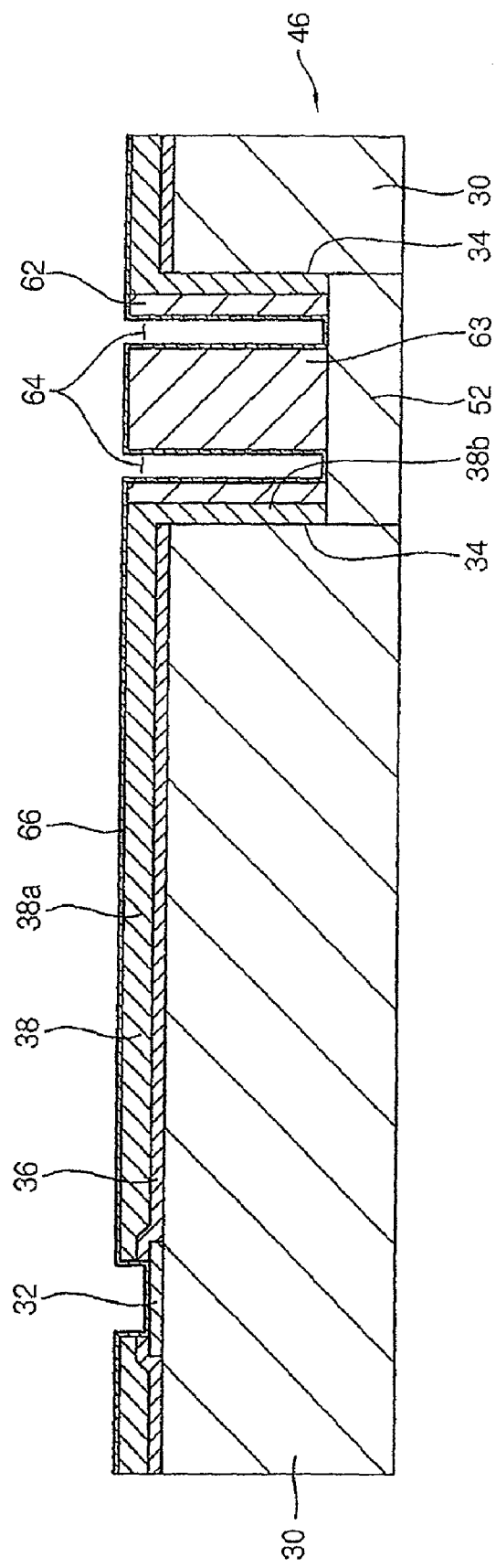

Referring to FIG. 5, a seed metal layer 66 is applied to an exposed surface of the resulting structure. In one example, the seed metal layer comprises Ti, Cu, or Ti/Cu, that is applied, for example, by a sputtering process.

Figure 6:
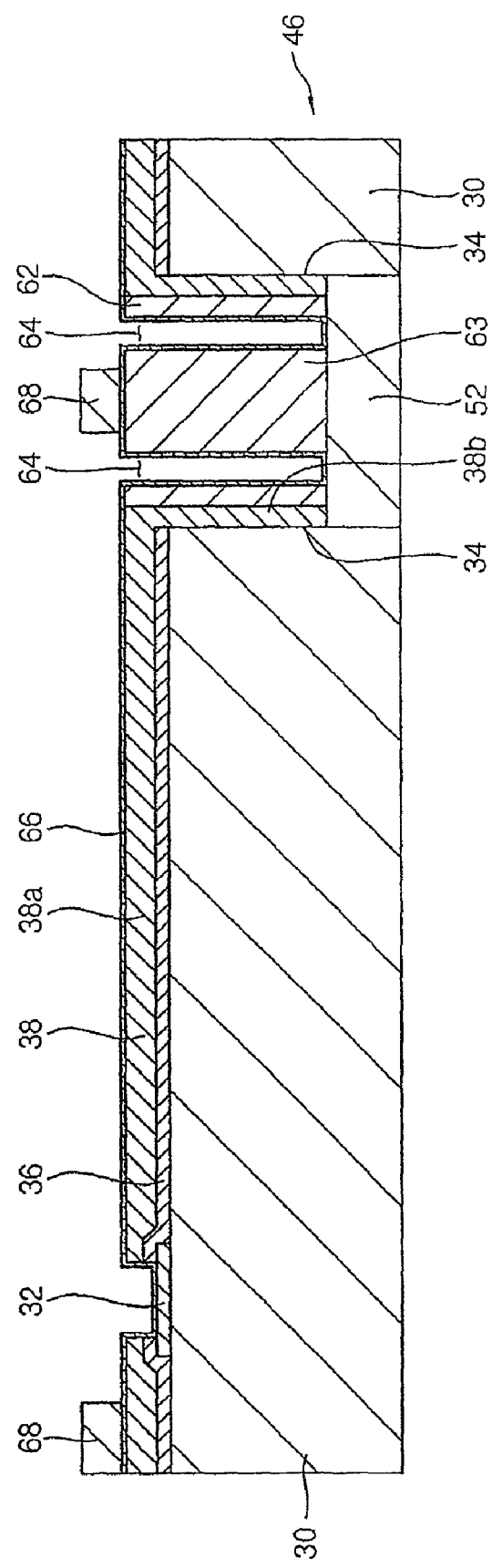

Referring to FIG. 6, a second photoresist layer is applied to the resulting structure, and is patterned to provide a second photoresist layer pattern 68 that exposes the underlying seed metal layer 66 between the bonding pad 32 and the second opening 64. In this example, a portion of the second photoresist layer pattern 68 remains on the middle section 63 of the first photoresist layer pattern 62, for later patterning of a conductive layer.

Figure 7:
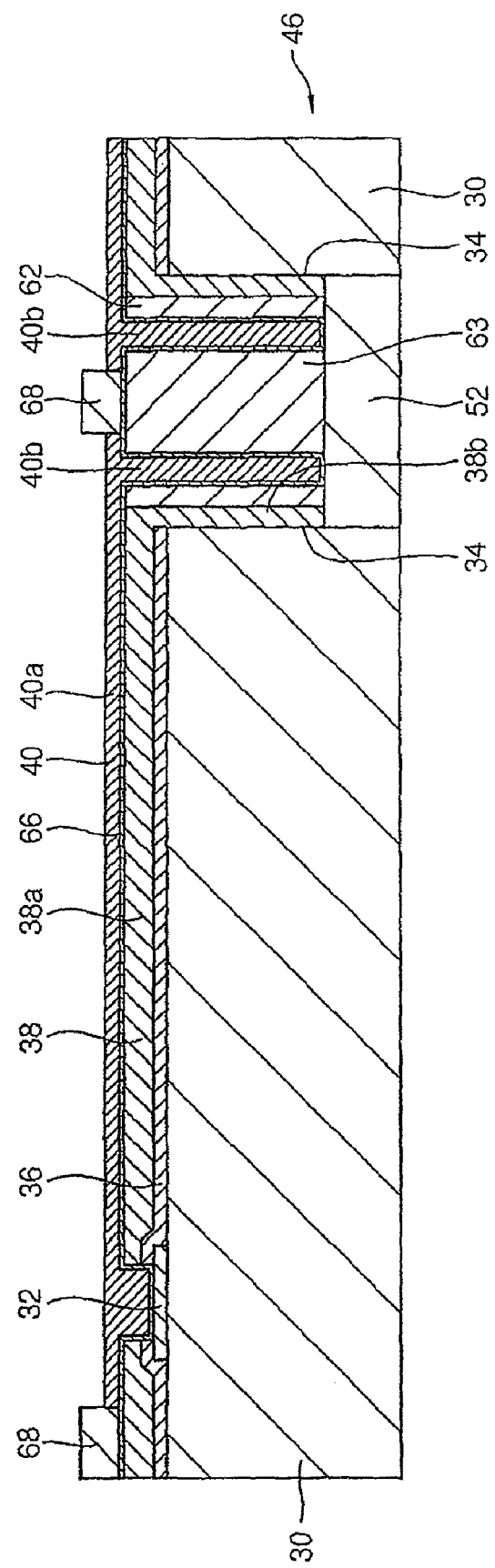

Referring to FIG. 7, a conductive layer is applied to the exposed seed metal layer 66 to form a conductive interconnect 40. At a first end, the conductive interconnect 40 contacts the bonding pad 32 through the opening in the dielectric layer pattern 38 and the oxide layer 36. The conductive interconnect 40 includes a horizontal portion 40a that extends horizontally across the horizontal portion 38a of the dielectric layer pattern 38, and a vertical portion 40b, or finger, that extends vertically from the horizontal portion 40a into the second opening 64 to fill the second opening 64. The second photoresist layer pattern portion 68 that lies on the middle section 63 of the first photoresist layer pattern 62 separates conductive interconnects 40 of adjacent dies that are defined by the scribe lane 52. The conductive layer used to form the conductive interconnect 40 comprises a conductive metal, for example Cu, Ni, or Au metal. The conductive layer can be formed, for example, by electroplating techniques, or by other conventional techniques.

Figure 8:
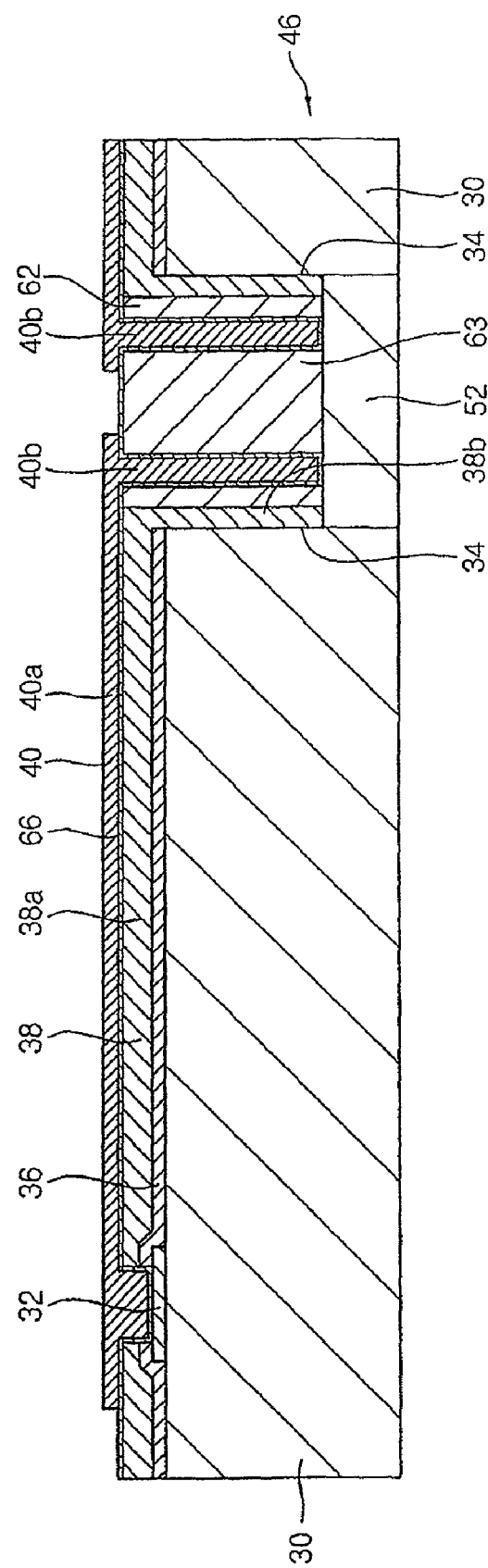

Referring to FIG. 8, the second photoresist pattern 68 is removed according to conventional techniques.

Figure 9:
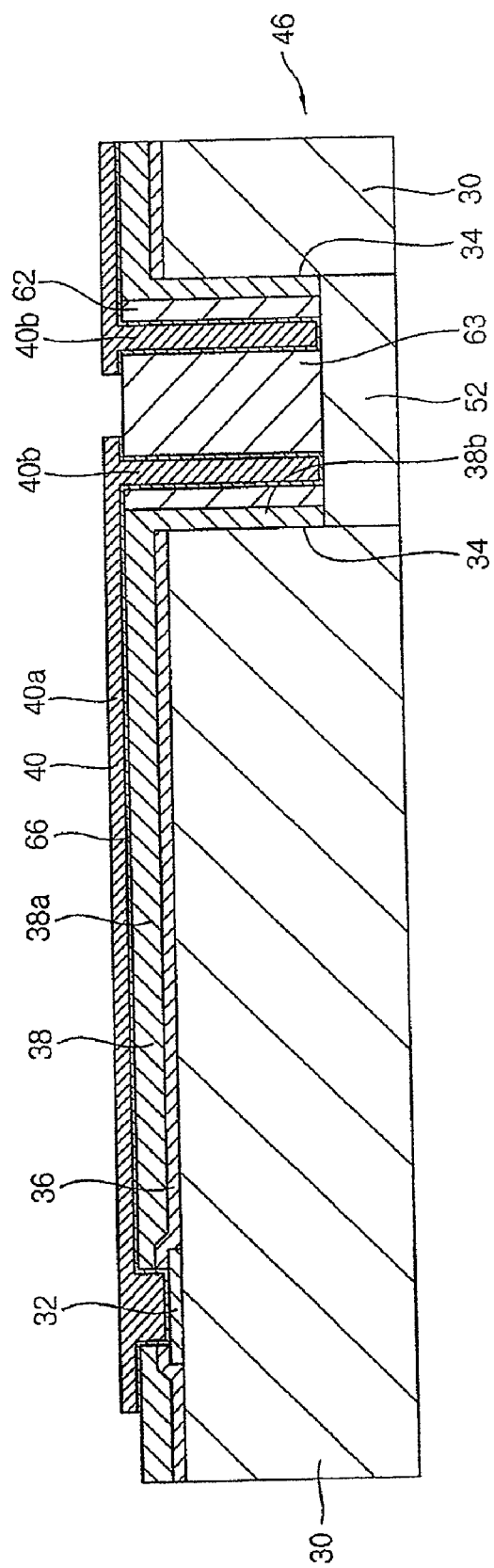

Referring to FIG. 9, portions of the seed metal layer 66 exposed by the removal of the second photoresist layer pattern 68 are removed according to conventional techniques. This includes a portion of the seed metal layer 66 that lies on the middle section 63 of the first photoresist layer pattern 62. This operation exposes an upper surface of the underlying first photoresist layer pattern 62.

Figure 10:
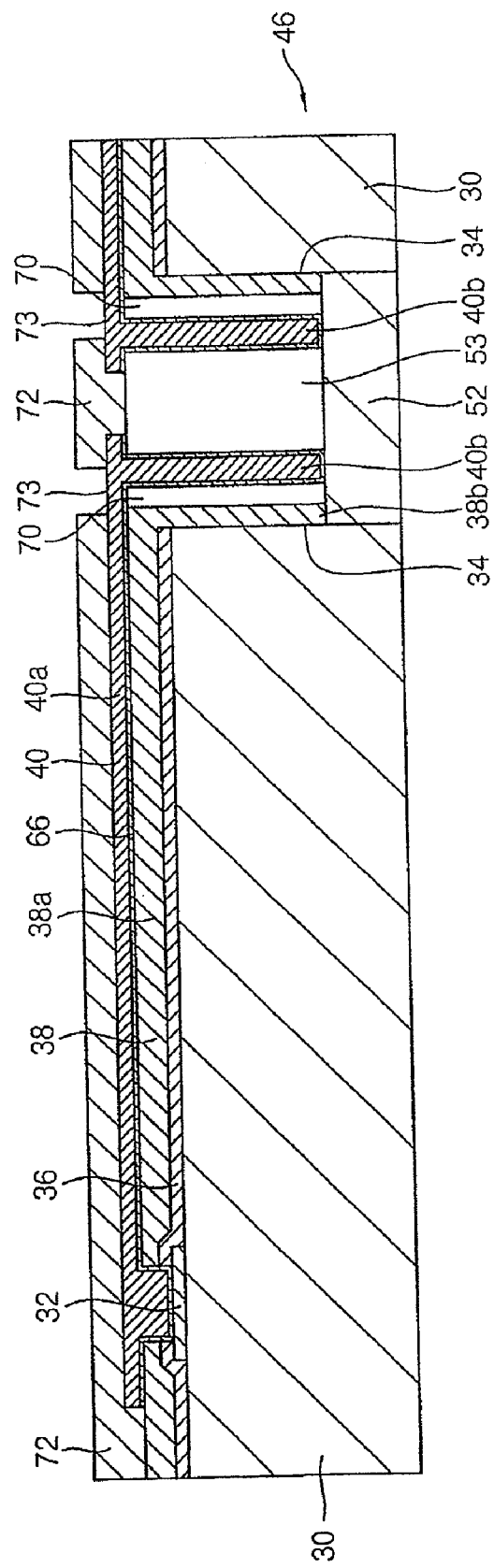

Referring to FIG. 10, the first photoresist layer pattern 62 occupying the first opening 53 of the scribe lane 52 is removed according to conventional techniques, for example by applying a rinse solvent. In a plan-view perspective of the resulting structure, the individual conductive interconnects 40 are separated from each other, each extending from a bonding pad and into the scribe lane region 52. Therefore, the underlying first photoresist layer pattern 62, 63 in the scribe lane region 52 is exposed both below the location of the second photoresist layer pattern 68 on middle section 63, and between the patterned individual conductive interconnects 40.

Upon removal of the first photoresist layer pattern 62, an air gap 70 is formed between the vertical portion 40b of each of the conductive interconnects 40 and the vertical portion 38b of the dielectric layer pattern 38. A second dielectric layer 72 is then formed on the resulting structure. The second dielectric layer 72 protects the underlying conductive interconnect 40 from interfering with a lower portion of a adjacent chip to be stacked on the present chip. The second dielectric layer 72 is optionally patterned to expose a top surface 73 of the conductive interconnect 40 above the vertical portion 40b of the conductive interconnect so that the chip can be stacked in a stacked chip package. In one embodiment, the second dielectric layer 72 includes an adhesive component and is beta-stage cured, or partially cured, to retain its adhesive properties so that when another chip is stacked above the present chip, the gap is filled between the chips by the second dielectric layer 72 and a bonding function is provided by the second dielectric layer 72. The layer 72 can later be fully cured to complete the chip bonding process.

Figure 11:
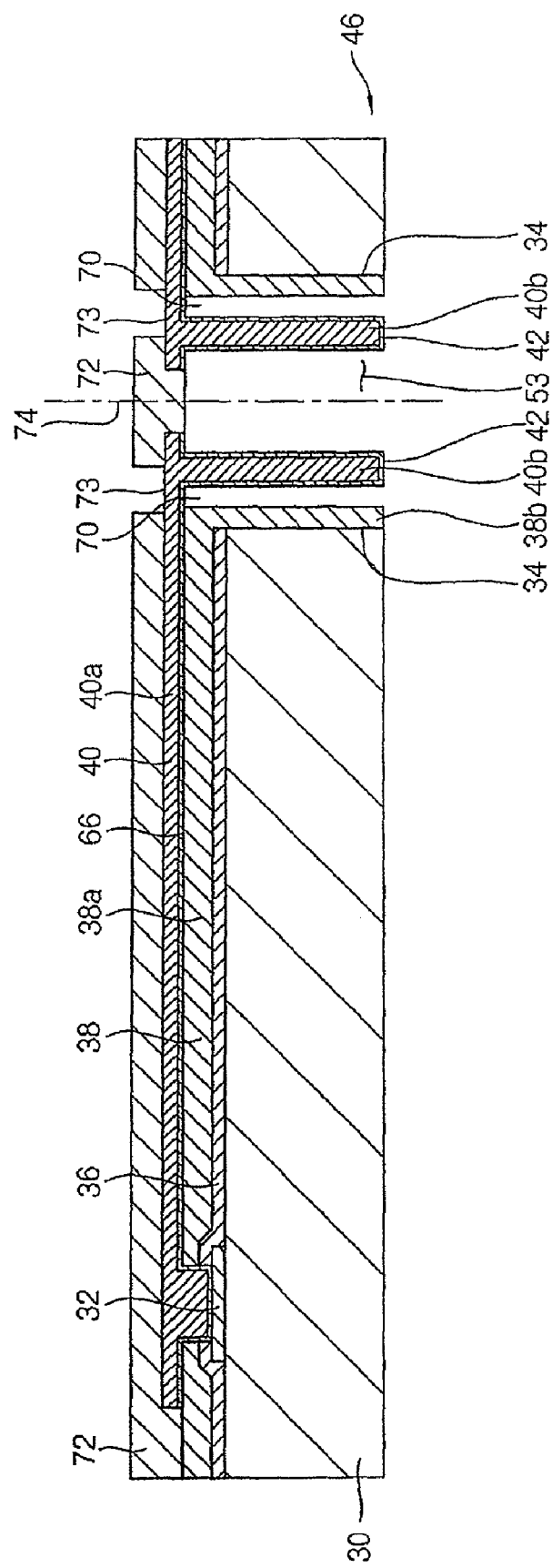

Referring to FIG. 11, the back surface 33 of the wafer is partially removed using, for example, mechanical polishing or chemical-mechanical polishing according to conventional techniques to expose a bottom edge 42 of the vertical portion 40b of the conductive interconnect 40. The dies of the wafer are thus separated at dicing line 74 to form multiple dies from a common wafer. The vertical portions 40b of the conductive interconnects 40 are thus configured as conductive fingers that extend beyond the outer edges 34 of the substrate 30, and provide a mechanism for transmitting and receiving signals to and from external, or off-chip, sources and destinations.

Figure 12:
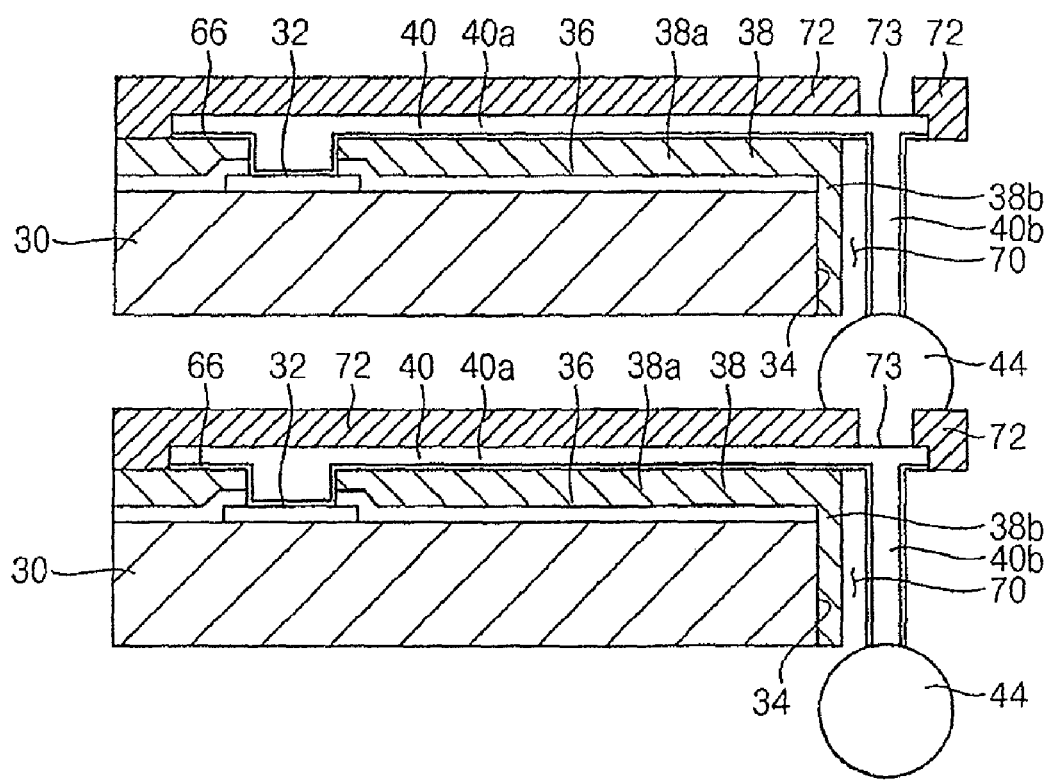

Referring to FIG. 12, wafer-level packages (WLPs) can be stacked and aligned to form a stacked chip package. Solder balls 44 are attached to the exposed bottom edges 42 of the vertical portions 40b of the conductive interconnects 40. The solder balls can be attached using any of a number of known techniques, including among others, ball attachment, solder jet and solder transfer processes, electro plating, and screen printing. The solder balls 44 associated with the various interconnects 40 are aligned with the exposed upper surfaces 73 of the underlying interconnects of the lower chip or substrate. The solder balls 44 provide for inter-chip bonding, anchoring two neighboring chips together by their conductive interconnects. In this manner, the solder balls 44 serve as a conductive bonding agent for the WLP. At the same time, the air gap 70 between the vertical portion 40b of each conductive interconnect 40 and the outer edge 34 of the chip substrate 30 allows for a degree in flexibility to facilitate movement between neighboring chips, while, at the same time, relieving stress due to thermal or mechanical mismatch.

Although the example of FIG. 12 illustrates the conductive interconnects of an upper chip being attached to conductive interconnects of a lower chip, the conductive interconnects can alternatively be bonded to a lower semiconductor substrate, wafer, or printed circuit board, in accordance with the present invention.

In addition, although the example of FIGS. 2-12 above illustrates a chip-level bonding approach in which a wafer, or wafers, including first and second chips, is prepared and diced prior to stacking and bonding using solder balls, the invention is equally applicable to a wafer-level bonding approach in which a first wafer including first chips and a second wafer including second chips are prepared, and the wafers themselves are stacked and bonded with solder balls prior to dicing of the resulting chip stacks.

FIGS. 13 through 20 are sectional views of a method for fabricating a wafer level package (WLP) in accordance with a second embodiment of the present invention.

Figure 13:
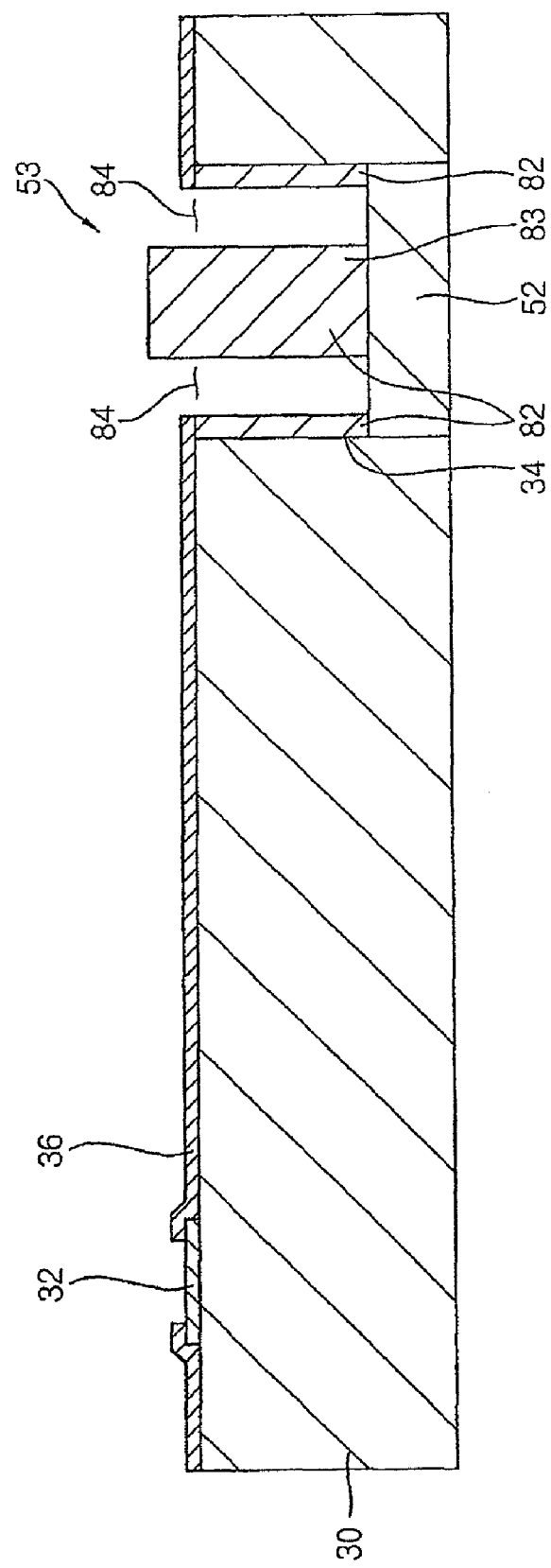
FIGS. 13 through 20 are sectional views of a method for fabricating a wafer level package (WLP) in accordance with a second embodiment of the present invention.

Referring to FIG. 13, the substrate of the present second embodiment is prepared in the same manner as that of the first embodiment as shown in FIG. 2. As in the first embodiment, the scribe lane 52 of the second embodiment is partially diced, or removed, to form a first opening 53 so that a lower portion of the substrate 30 body remains in the scribe lane 52. In one example, the scribe lane 52 is partially diced to a depth that corresponds with the eventual desired length of the vertical portions 40b of the conductive interconnects 40 (see FIG. 20, below). An outer edge 34 of the die is exposed by the partial dicing of the scribe lane 52 in the opening 53. A first photoresist layer is then formed in the first opening 53 and is patterned to provide a first photoresist layer pattern 82 including a second opening 84. In a case where the scribe lane 52 is provided between adjacent dies of the wafer, the first photoresist layer pattern 82 includes dual second openings 84, the dual second openings 84 being separated by a middle section 83 of the first photoresist layer pattern 82. Left and right portions of the first photoresist layer pattern are applied directly to the outer edges 34 of the neighboring substrates 30 on each side of the scribe lane 52.

Figure 14:
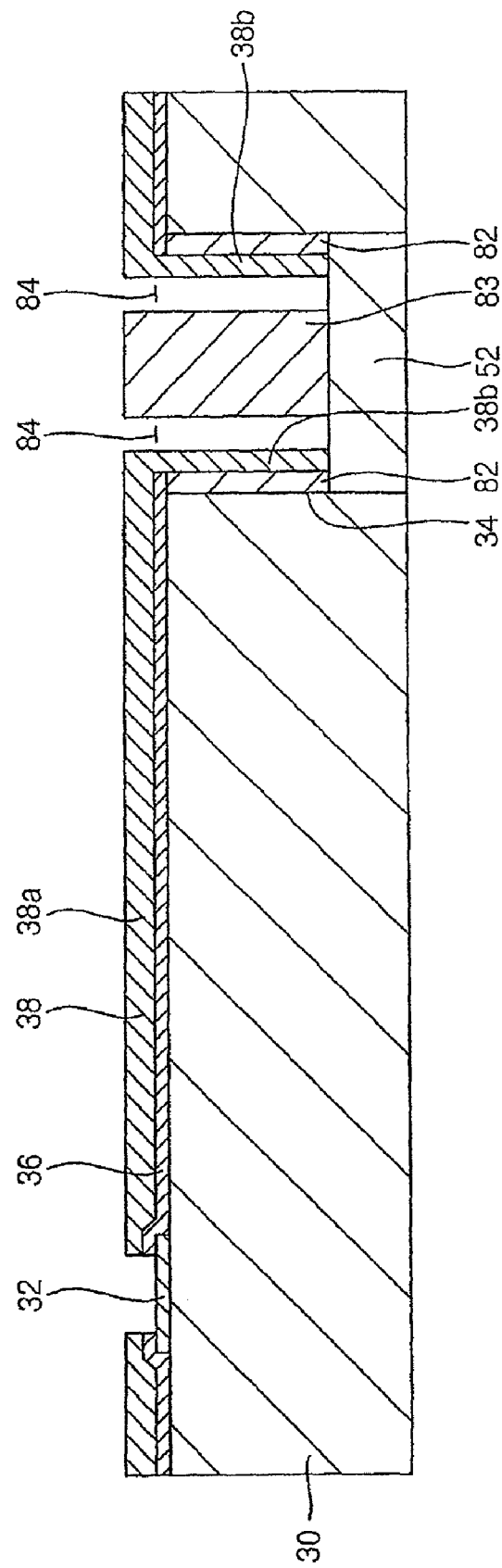

Referring to FIG. 14, a dielectric layer is then applied to the resulting structure, and the dielectric layer is patterned to expose an upper surface of the underlying bonding pad 32. The dielectric layer pattern 38 includes a horizontal portion 38a that extends horizontally across a top surface of the semiconductor substrate to the outer edge 34 of the substrate and a vertical portion 38b that extends vertically from the horizontal portion 38a in a direction along the first photoresist layer pattern 82 that lies on the outer edge 34 of the substrate. The dielectric layer comprises a dielectric material, for example photosensitive polyimide (PSPI), photosensitive polybenzooxazole (PSPBO), silicon nitride (SiN), or silicon oxide (SiO).

Figure 15:
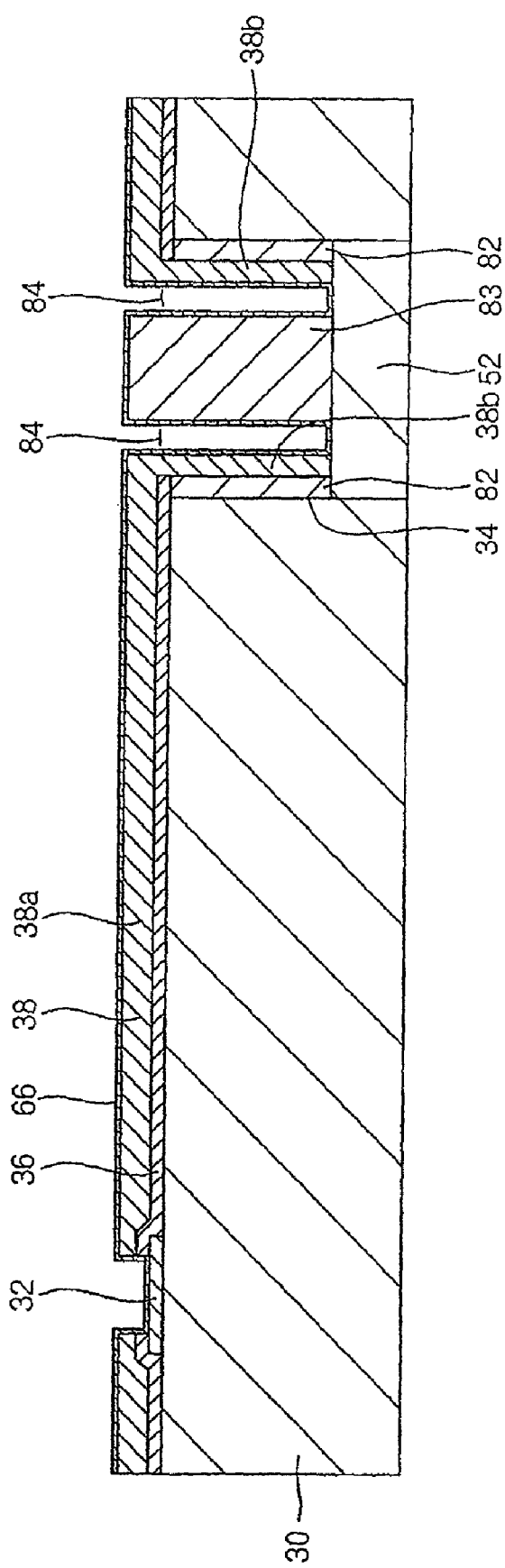

Referring to FIG. 15, a seed metal layer 66 is applied to an exposed surface of the resulting structure. In one example, the seed metal layer comprises Ti, Cu, or Ti/Cu, that is applied, for example, by a sputtering process.

Figure 16:
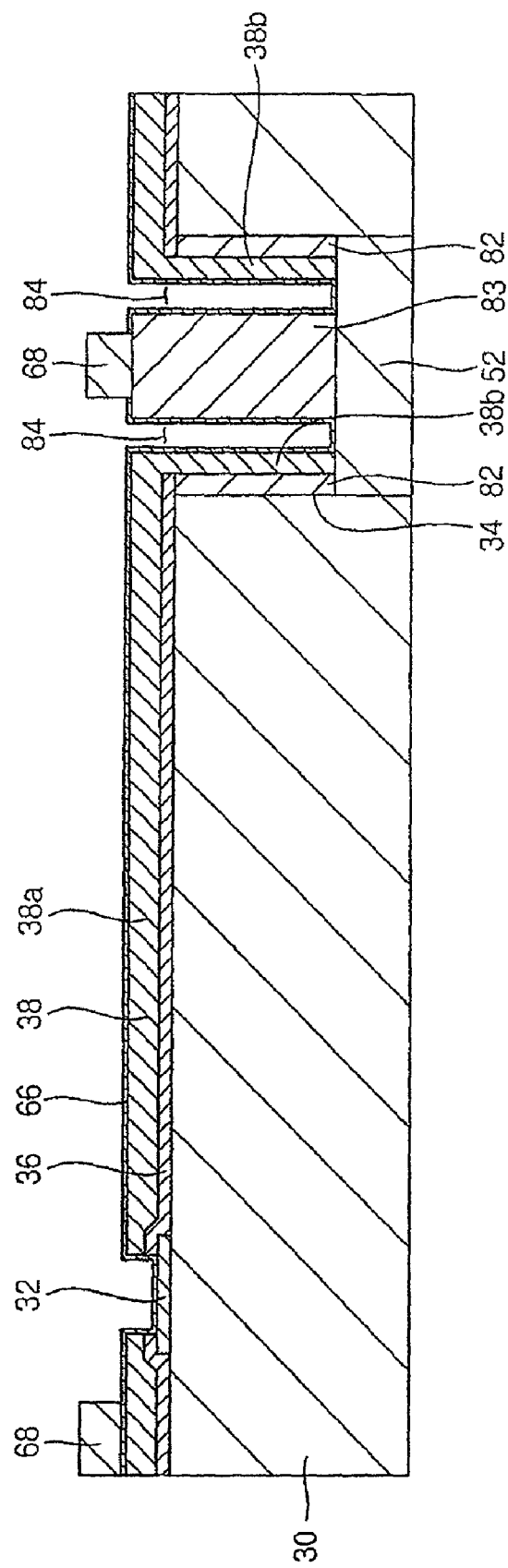

Referring to FIG. 16, a second photoresist layer is applied to the resulting structure, and is patterned to provide a second photoresist layer pattern 68 that exposes the underlying seed metal layer 32 between the bonding pad 32 and the second opening 84. In this example, a portion of the second photoresist layer pattern 68 remains on the middle section 83 of the first photoresist layer pattern 82, for later patterning of a conductive layer.

Figure 17:
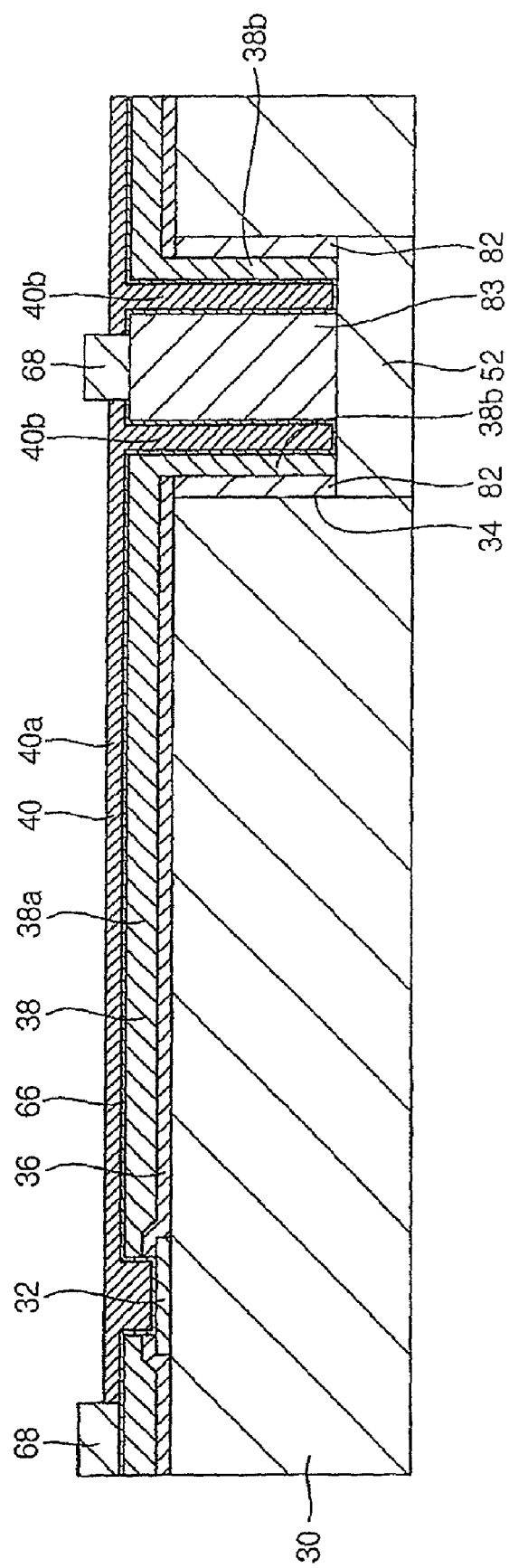

Referring to FIG. 17, a conductive layer is applied to the exposed seed metal layer 66 to form a conductive interconnect 40. At a first end, the conductive interconnect 40 contacts the bonding pad 32 through the opening in the dielectric layer pattern 38 and the oxide layer 36. The conductive interconnect 40 includes a horizontal portion 40a that extends horizontally across the horizontal portion 38a of the dielectric layer pattern 38, and a vertical portion 40b that extends vertically from the horizontal portion 40a into the second opening 84 to fill the second opening 84. The second photoresist layer pattern portion 68 that lies on the middle section 83 of the first photoresist layer pattern 82 separates conductive interconnects 40 of adjacent dies that are defined by the scribe lane 52. The conductive layer used to form the conductive interconnect 40 comprises a conductive metal, for example Cu, Ni, or Au metal. The conductive layer can be formed, for example, by electroplating techniques, or by other conventional techniques.

Figure 18:
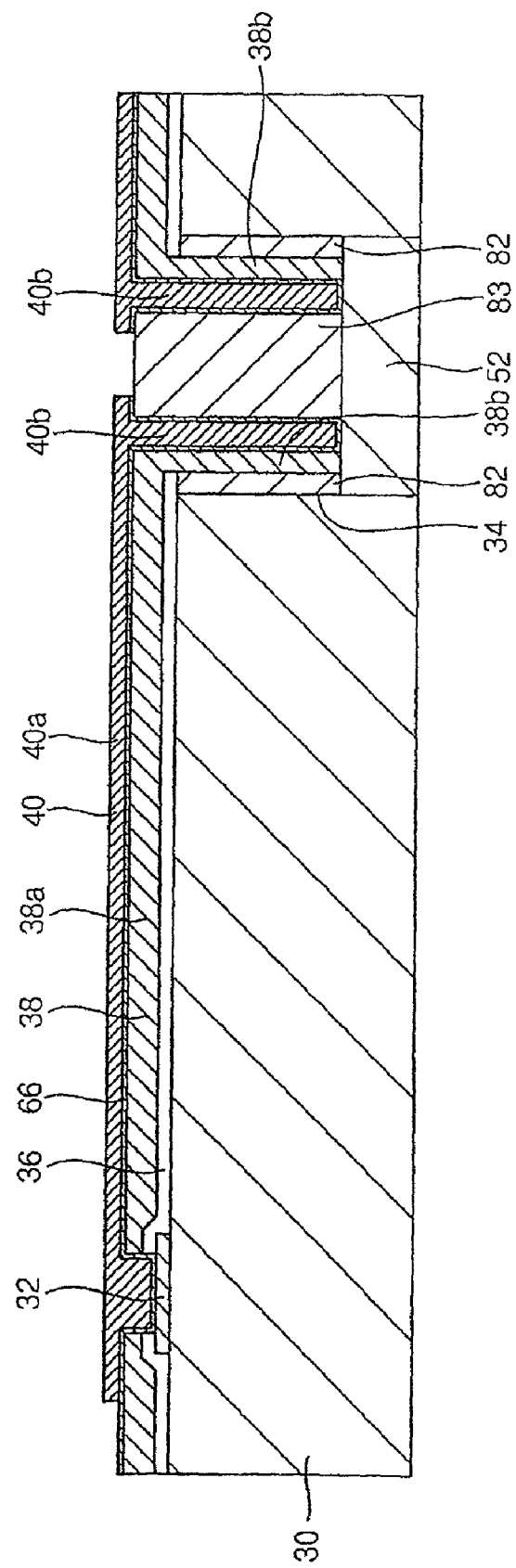

Referring to FIG. 18, the second photoresist pattern 68 is removed according to conventional techniques.

Figure 19:
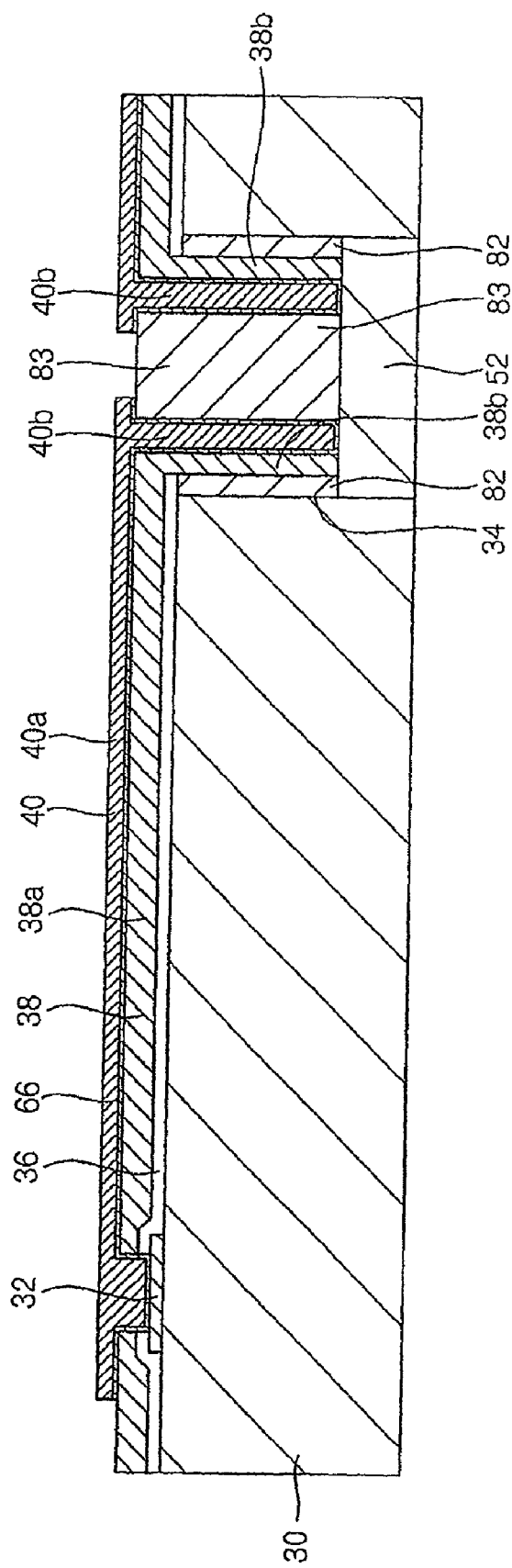

Referring to FIG. 19, portions of the seed metal layer 66 exposed by the removal of the second photoresist layer pattern 68 are removed according to conventional techniques. This includes a portion of the seed metal layer that lies on the middle section 83 of the first photoresist layer pattern 82. This operation exposes an upper surface of the underlying first photoresist layer pattern 82.

Figure 20:
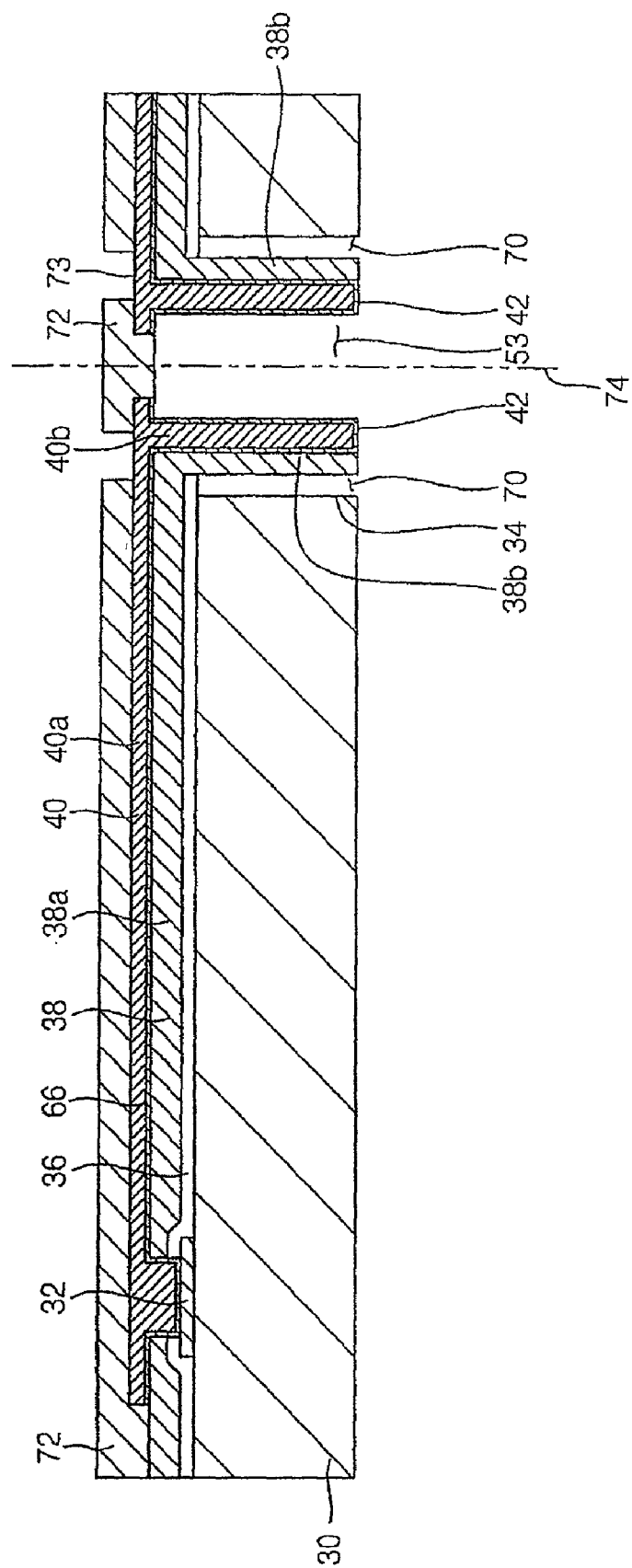

Referring to FIG. 20, the first photoresist layer pattern 82, 83 occupying the first opening 53 of the scribe lane 52 is removed according to conventional techniques, for example by applying a rinse solvent. As described above, the underlying first photoresist layer pattern 82, 83 in the scribe lane region 52 is exposed both below the location of the second photoresist layer pattern 68 on middle section 83, and between the patterned individual conductive interconnects 40. Accordingly, upon removal of the first photoresist layer pattern, an air gap 70 is formed between the vertical portion 40b of the conductive interconnect 40 and the outer edge 34 of the substrate 30. In particular, in the present second embodiment, the air gap 70 is between the vertical portion 38b of the dielectric layer pattern 38 adjacent the vertical portion 40b of each of the conductive interconnects 40, and the outer edge 34 of the substrate 30. A second dielectric layer 72 is then formed on the resulting structure. As described above, the second dielectric layer 72 protects the underlying conductive interconnect 40 from interfering with a lower portion of a adjacent chip to be stacked on the present chip. The second dielectric layer 72 is optionally patterned to expose a top surface 73 of the conductive interconnect 40 above the vertical portion 40b of the conductive interconnect so that the chip can be stacked in a stacked chip package. As stated above, the second dielectric layer can be used as an inter-chip adhesive layer that fills the gap between adjacent chips.

The back surface 33 of the wafer is partially removed using, for example, mechanical polishing or chemical-mechanical polishing according to conventional techniques to expose a bottom edge 42 of the vertical portion 40b of the conductive interconnect 40. The dies of the wafer are thus separated at dicing line 74 to form multiple dies from a common wafer. The vertical portions 40b of the conductive interconnects 40 are thus configured as conductive fingers that extend beyond the outer edges 34 of the substrate 30, and provide a mechanism for transmitting and receiving signals to and from external, or off-chip, sources and destinations, as described above. The resulting device or devices can then be further processed and packaged in the manner described above.

FIGS. 21 and 22 are sectional views of a method for fabricating a wafer level package (WLP) in accordance with a third embodiment of the present invention.

The embodiment of FIG. 21 is similar in structure to the first embodiment as depicted in FIG. 11, in that the vertical portion 38b of the dielectric layer pattern 38 lies directly on the outer edge 34 of the substrate 30, and the vertical portions 40b of the conductive interconnects 40 are spaced apart from the vertical portion 38b of the dielectric layer pattern 38. However, in the present embodiment of FIG. 21, the air gap, or void, between each vertical portion 40b of the conductive interconnect 40 and the vertical portion 38b of the dielectric layer pattern 38 is filled with an elastomer material 92. The elastomer material 92 can be provided following removal of the first photoresist layer pattern 62 occupying the first opening 53, as described above in conjunction with FIG. 10. Alternatively, the elastomer material 92 can be provided as a substitute for the first photoresist layer pattern 62, as described above in conjunction with FIG. 4, and remain throughout the process, following formation of the conductive interconnects 40, to provide the embodiment of FIG. 21.

The embodiment of FIG. 22 is similar in structure to the second embodiment as depicted in FIG. 20, in that the vertical portion 38b of the dielectric layer pattern 38 is spaced apart from the outer edge 34 of the substrate 30, and the vertical portions 40b of the conductive interconnects 40 are adjacent the vertical portion 38b of the dielectric layer pattern 38. However, in the present embodiment of FIG. 22, the air gap, or void, between the outer edge 34 of the substrate 30 and the vertical portion 38b of the dielectric layer pattern 38 is filled with an elastomer material 92. The elastomer material 92 can be provided following removal of the first photoresist layer pattern 82 occupying the first opening 53, as described above in conjunction with FIG. 20. Alternatively, the elastomer material 92 can be provided as a substitute for the first photoresist layer pattern 82, as described above in conjunction with FIG. 13, and remain throughout the process, following formation of the conductive interconnects 40, to provide the embodiment of FIG. 22.

In the embodiments of FIGS. 21 and 22, the elastomer comprises, for example, siloxane, and operates as a compliant and compressible stress-relief spacer between the vertical portion 40b of the conductive interconnect 40 and the outer edge 34 of the substrate 30, thereby improving the reliability of the resulting packaged device. The modulus of elasticity of the elastomer is in a range, for example, between about 10 and 1000 MPa. The elastomer material 92 operates to further absorb externally generated stress or shock imparted on the conductive interconnects 40.

In this manner, a wafer-level package having a stress relief spacer, and a manufacturing method thereof are provided. Metal fingers that extend from the body of a chip provide for both inter-chip electrical interconnection and inter-chip mechanical anchoring. The metal fingers are isolated from the body of the chip by a stress-relief spacer. In one example, such isolation takes the form of an air gap. In another example, such isolation takes the form of an elastomer material. In either case, CTE mismatch between the metal fingers and the body of the chip is avoided, alleviating the problems associated with cracking and delamination in the conventional approaches. This alleviates damage that can arise during the chip stacking process, and leads to an improvement in device yield and device reliability.

While this invention has been particularly shown and described with references to preferred embodiments thereof, it will be understood by those skilled in the art that various changes in form and details may be made herein without departing from the spirit and scope of the invention as defined by the appended claims.

What is claimed is:

1. A semiconductor device comprising:
a semiconductor substrate;
a conductive interconnect corresponding to the substrate, the conductive interconnect including a first portion and a second portion, the first portion disposed in the semiconductor substrate and the second portion disposed on a surface of the semiconductor substrate; and
an air gap between a sidewall of the first portion of the conductive interconnect and its corresponding substrate.

2. The semiconductor device of claim 1, wherein the first portion and the second portion of the conductive interconnect are connected perpendicularly with respect to each other.

3. The semiconductor device of claim 1, further comprising a dielectric layer disposed between the air gap and the sidewall of the first portion of the conductive interconnect.

4. The semiconductor device of claim 1, further comprising a dielectric layer between the semiconductor substrate and the second portion of the conductive interconnect.

5. The semiconductor device of claim 1, wherein the conductive interconnect comprises copper.

6. The semiconductor device of claim 1, wherein the first portion of the conductive interconnect is disposed on a solder ball.

7. The semiconductor of claim 1, wherein the second portion of the conductive interconnect is electrically connected to an electronic circuit disposed at the substrate.

8. A semiconductor device comprising:
   a semiconductor substrate;
   a conductive interconnect corresponding to the substrate, the conductive interconnect including a first portion and a second portion, the first portion disposed in the semiconductor substrate and the second portion disposed on a surface of the semiconductor substrate; and
   an air gap between a sidewall of the first portion of the conductive interconnect and its corresponding substrate,
   wherein the first portion of the conductive interconnect passes through the semiconductor substrate.

9. The semiconductor device of claim 8, wherein the first portion and the second portion of the conductive interconnect are connected perpendicularly to each other.

10. The semiconductor device of claim 8, further comprising a dielectric layer disposed between the air gap and the sidewall of the first portion of the conductive interconnect.

11. The semiconductor device of claim 8, further comprising a dielectric layer disposed between the air gap and the portion of the semiconductor substrate.

12. The semiconductor device of claim 8, further comprising a dielectric layer disposed between the second portion of the conductive interconnect and the surface of the semiconductor substrate.

13. The semiconductor device of claim 8, wherein the conductive interconnect comprises copper.

14. The semiconductor device of claim 8, wherein the first portion of the conductive interconnect is disposed on a solder ball.

15. The semiconductor device of claim 8, wherein the second portion of the conductive interconnect is electrically connected to an electronic circuit disposed at the substrate.

16. A semiconductor device comprising:
    a semiconductor substrate;
    a conductive interconnect corresponding to the substrate, the conductive interconnect substantially vertically disposed in the semiconductor substrate; and
    an air gap between a sidewall of the conductive interconnect and its corresponding substrate.

17. The semiconductor device of claim 16, wherein the conductive interconnect completely passes through the semiconductor substrate.

18. The semiconductor device of claim 16, further comprising a dielectric layer disposed between the air gap and the sidewall of the conductive interconnect.

19. The semiconductor device of claim 16, wherein the conductive interconnect comprises copper.

20. The semiconductor device of claim 16, wherein the conductive interconnect is disposed on a solder ball.

21. A semiconductor device comprising:
    a semiconductor substrate having an upper surface and a lower surface;
    a conductive interconnect corresponding to the substrate, the conductive interconnect having a first portion extending substantially vertically from the upper surface to at least the lower surface; and
    an air gap between at least part of the first portion of the conductive interconnect and its corresponding substrate.

22. The semiconductor device of claim 21, wherein the air gap is between a portion of the substrate and a portion of the first portion of the conductive interconnect.

23. The semiconductor device of claim 21, wherein the conductive interconnect extends beyond the lower surface of the substrate.

24. The semiconductor device of claim 21, wherein the conductive interconnect further includes a substantially horizontal second portion that is at least partially disposed on the substrate upper surface.

25. The semiconductor device of claim 24, wherein the second portion of the conductive interconnect is electrically connected to a circuit on the substrate.

26. The semiconductor device of claim 21, further comprising:
    a dielectric layer disposed between the conductive interconnect and the substrate.

27. The semiconductor device of claim 21, wherein the first portion of the conductive interconnect has a lower portion connected to a solder ball.

28. The semiconductor device of claim 21, wherein the conductive interconnect comprises copper.

* * * * *